US010753993B2

(12) United States Patent
Huang et al.

(10) Patent No.: US 10,753,993 B2
(45) Date of Patent: Aug. 25, 2020

(54) GRADIENT AMPLIFIER DRIVER STAGE CIRCUIT, GRADIENT AMPLIFIER SYSTEM AND CONTROL METHOD THEREOF

(71) Applicant: Delta Electronics (Shanghai) CO., LTD, Shanghai (CN)

(72) Inventors: He Huang, Shanghai (CN); Misha Kumar, Shanghai (CN); Laszlo Huber, Shanghai (CN); Jinzhu Xue, Shanghai (CN); Dezhi Jiao, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 16/243,244

(22) Filed: Jan. 9, 2019

(65) Prior Publication Data

US 2019/0212403 A1 Jul. 11, 2019

(30) Foreign Application Priority Data

Jan. 11, 2018 (CN) .......................... 2018 1 0026826

(51) Int. Cl.
*G01V 3/00* (2006.01)
*G01R 33/385* (2006.01)
(Continued)

(52) U.S. Cl.
CPC .......... *G01R 33/3852* (2013.01); *H02M 7/49* (2013.01); *H02M 7/493* (2013.01); *H03F 1/30* (2013.01); *H03F 3/211* (2013.01); *H03F 3/3081* (2013.01); *G01R 33/3856* (2013.01); *H02M 7/501* (2013.01); *H02M 7/5387* (2013.01); *H03F 2200/171* (2013.01); *H03F 2200/301* (2013.01);
(Continued)

(58) Field of Classification Search
USPC ......................................................... 324/307
See application file for complete search history.

(56) References Cited

U.S. PATENT DOCUMENTS 5,546,299 A * 8/1996 Lenz .................. G01R 33/3852
363/65
6,118,337 A 9/2000 Schweighofer
(Continued)

FOREIGN PATENT DOCUMENTS

CN 1247319 A 3/2000
CN 103176150 A 6/2013
(Continued)

OTHER PUBLICATIONS

The CN1OA issued on Jul. 31, 2019 by the CNIPA.
(Continued)

*Primary Examiner* — Rodney E Fuller
(74) *Attorney, Agent, or Firm* — Yunling Ren

(57) ABSTRACT

A gradient amplifier driver stage circuit includes: a gradient coil and a plurality of gradient driver modules electrically cascaded with each other and forming an output end, the output end being electrically connected to the gradient coil, wherein each gradient driver module includes a pre-stage power supply and a bridge amplifier connected in parallel, output voltage of the pre-stage power supplies of the plurality of gradient driver modules are the same, and each gradient driver module is configured to provide an inductive voltage drop and a resistive voltage drop on the gradient coil.

20 Claims, 10 Drawing Sheets

(51) Int. Cl.
  *H03F 3/21*   (2006.01)
  *H03F 1/30*   (2006.01)
  *H02M 7/49*   (2007.01)
  *H02M 7/493*  (2007.01)
  *H03F 3/30*   (2006.01)
  *H02M 7/5387* (2007.01)
  *H02M 7/501*  (2007.01)

(52) U.S. Cl.
  CPC .................. *H03F 2200/33* (2013.01); *H03F 2203/21106* (2013.01); *H03F 2203/21157* (2013.01)

(56) References Cited

U.S. PATENT DOCUMENTS

| | | | |
|---|---|---|---|
| 6,323,649 | B1 | 11/2001 | Pace et al. |
| 7,116,166 | B2 | 10/2006 | Sabate et al. |
| 9,389,288 | B2 | 7/2016 | Sabate et al. |
| 9,551,767 | B2 | 1/2017 | Sabate et al. |
| 2005/0275404 | A1* | 12/2005 | Sabate ............... G01R 33/3852 324/322 |
| 2006/0152222 | A1* | 7/2006 | Trabbic .............. G01R 33/3852 324/322 |
| 2013/0162250 | A1 | 6/2013 | Sabate et al. |
| 2014/0077812 | A1 | 3/2014 | Sabate |
| 2015/0130464 | A1 | 5/2015 | Huisman et al. |
| 2017/0264248 | A1 | 9/2017 | Mei et al. |
| 2017/0363698 | A1 | 12/2017 | Lin |
| 2019/0369183 | A1* | 12/2019 | Wang ..................... G01R 31/72 |

FOREIGN PATENT DOCUMENTS

| | | |
|---|---|---|
| CN | 104142483 A | 11/2014 |
| CN | 105591537 A | 5/2016 |
| CN | 106797172 A | 5/2017 |
| CN | 107005150 A | 8/2017 |
| JP | 2009-39247 A | 2/2009 |

OTHER PUBLICATIONS

The JP1OA issued Nov. 26, 2019 by the JPO.
The TW1OA issued by TW Patent Office dated Dec. 5, 2017.
The JPNOA issued Apr. 21, 2020 by the JPO.

* cited by examiner

GRADIENT AMPLIFIER DRIVER STAGE CIRCUIT, GRADIENT AMPLIFIER SYSTEM AND CONTROL METHOD THEREOF

CROSS REFERENCE

This application is based upon and claims priority to Chinese Patent Application No. 201810026826.3, filed on Jan. 11, 2018, the entire contents thereof are incorporated herein by reference.

TECHNICAL FIELD

The present disclosure relates to amplifier technologies, and in particular, to a gradient amplifier driver stage circuit, a gradient amplifier system, and a control method thereof.

BACKGROUND

Magnetic resonance imaging (MRI) technology has advantages such as intensive information, multi-directional imaging and high resolution. Therefore, since its first application in 1980, MRI technology has developed rapidly and has been applied widely as an important means for clinical disease diagnosis.

As one of the important components of a MRI imager, a gradient amplifier is used to drive gradient coils in the MRI imager to generate gradient magnetic field to provide positional information. In order to reduce the imaging time and ensure the image quality, the MRI system requires a high-resolution, high-precision, stable strong magnetic field to be established in the coil in a short time. Therefore, the gradient amplifier is required to have the ability to output high voltage as well as high precision and large current. The gradient coil in the nuclear magnetic resonance instrument is generally a hollow inductor with a length of 2 m and a diameter of 90 cm. In order to shorten the time for establishing the magnetic field, when the magnetic field is established, the current in the coil is required to have a high slew rate, so that the current in the inductor can quickly reach a preset value; and after the magnetic field is established, it is necessary to maintain the required large current accurately and stably in the coil, and the slew rate of the current at this time is low. Taking a typical current waveform (i.e. a trapezoidal wave) on a gradient coil, shown in FIG. 1 as an example, the process of establishing the magnetic field corresponds to a rising edge stage and a falling edge stage in the trapezoidal wave. The slew rate of the current is extremely high in those stages. After the magnetic field is established, the current is maintained at the preset value precisely and stably, and at this time, the current slew rate is extremely low. Therefore, the gradient amplifier used to drive the gradient coil is required to have the ability to output high voltage to obtain a higher slew rate of current, and to maintain the output high-precision and large current at a low output voltage too.

The available gradient amplifiers in the market today generally employ full-bridge converter technology. Due to the characteristics of silicon-based devices, most of the gradient amplifiers apply high-low voltage bridges cascade structure, whose disadvantages include uneven thermal distribution problem, low device utilization, poor reliability, and complicated system expansion.

SUMMARY

The present disclosure provides a gradient amplifier driver stage circuit, a gradient amplifier system and a control method thereof.

According to a first aspect of the present disclosure, there is provided a gradient amplifier driver stage circuit, including: a gradient coil and a plurality of gradient driver modules, the plurality of gradient driver modules being electrically cascaded with each other and forming an output end, the output end being electrically connected to the gradient coil, wherein each gradient driver module includes a pre-stage power supply and a bridge amplifier connected in parallel, output voltage of the pre-stage power supplies of the plurality of gradient driver modules are the same, and each gradient driver module is configured to provide an inductive voltage drop and a resistive voltage drop on the gradient coil.

In some embodiments, the plurality of gradient driver modules have the same topology.

In some embodiments, the plurality of gradient driver modules have the same control signal interfaces.

In some embodiments, the pre-stage power supplies of the plurality of gradient driver modules are isolated or non-isolated circuits.

In some embodiments, the pre-stage power supplies of the plurality of gradient driver modules are DC/DC or AC/DC circuits.

In some embodiments, the pre-stage power supplies of the plurality of gradient driver modules are isolated DC/DC circuits.

In one embodiment, each bridge amplifier includes a full-bridge circuit, and each full-bridge circuit is composed of four switch components; wherein a second end of a first switch component of each full-bridge circuit is connected to a first end of a second switch component to form each bridge arm, and a connection point thereof is a midpoint of the first bridge arm; a second end of a third switch component of a first full-bridge circuit is connected to a first end of a fourth switch component to form a second bridge arm, and a connection point thereof is a midpoint of the second bridge arm; a first end of the first switch component and a first end of the third switch component are electrically connected to a first output end of the pre-stage power supply; and a second end of the second switch component and a second end of the fourth switch component are electrically connected to a second output end of the pre-stage power supply; wherein the full-bridge circuits of the plurality of gradient driver modules are connected in series, and the midpoint of the second bridge arm of each full-bridge circuit is connected to the midpoint of the first bridge arm of the next full-bridge circuit, and the midpoint of the first bridge arm of the first full-bridge circuit is electrically connected to a first end of the gradient coil, and the midpoint of the second bridge arm of the last full-bridge circuit is electrically connected to a second end of the gradient coil.

In one embodiment, the gradient amplifier driver stage circuit includes at least one coupling inductor, each bridge amplifier including a first full-bridge circuit and a second full-bridge circuit, the first full-bridge circuit is connected in parallel to the second full-bridge circuit, and the first full-bridge circuit and the second full-bridge circuit are each composed of four switch components, wherein a second end of a first switch component of each full-bridge circuit is connected to a first end of a second switch component to form a first bridge arm, and a connection point thereof is a midpoint of the first bridge arm; a second end of a third switch component of a first full-bridge circuit is connected to a first end of a fourth switch component to form a second bridge arm, and the connection point thereof is a midpoint of the second bridge arm; wherein, in each bridge amplifier, the first full-bridge circuit and the second full-bridge circuit are connected in parallel, and a first end of the first switch component and a first end of the third switch component are electrically connected to a first output end of the pre-stage power supply, and a second end of the second switch component and a second end of the fourth switch component are electrically connected to a second output end of the pre-stage power supply; wherein, in each bridge amplifier, the midpoint of the first bridge arm of the first full-bridge circuit is electrically connected to the midpoint of the first bridge arm of the second full-bridge circuit via a first winding and a second winding of a first coupling inductor; a connection point of the first winding and the second winding of the first coupling inductor is a first connection output end corresponding to the bridge amplifier; the midpoint of the second bridge arm of the first full-bridge circuit is electrically connected to the midpoint of the second bridge arm of the second full-bridge circuit via a first winding and a second winding of a second coupling inductor; a connection point of the first winding and the second winding of the second coupling inductor is a second connection output end corresponding to the bridge amplifier; and wherein the bridge amplifiers of the plurality of gradient driver modules are connected in series, the second connection output end corresponding to each bridge amplifier is connected to the first connection output end corresponding to the next bridge amplifier, the first connection output end corresponding to the first bridge amplifier in series is electrically connected to a first end of the gradient coil, and the second connection output end corresponding to the last bridge amplifier in series is electrically connected to a second end of the gradient coil.

In one embodiment, the gradient amplifier driver stage circuit includes at least one coupling inductor, each bridge amplifier includes a first full-bridge circuit and a second full-bridge circuit, the first full-bridge circuit and the second full-bridge circuit are each composed of four switch components; wherein a second end of a first switch component of each full-bridge circuit is connected to a first end of a second switch component to form a first bridge arm, and a connection point thereof is a midpoint of the first bridge arm; a second end of a third switch component of a first full-bridge circuit is connected to a first end of a fourth switch component to form a second bridge arm, and the connection point thereof is a midpoint of the second bridge arm; wherein, in each bridge amplifier, the first full-bridge circuit and the second full-bridge circuit are connected in parallel, and a first end of the first switch component and a first end of the third switch component are electrically connected to a first output end of the pre-stage power supply, a second end of the second switch component and a second end of the fourth switch component are electrically connected to a second output of the pre-stage power supply; wherein the first full-bridge circuits of the bridge amplifiers of the plurality of gradient driver modules are connected in series, the second full-bridge circuits are connected in series, the midpoint of the second bridge arm of the first full-bridge circuit of each bridge amplifier is electrically connected to the midpoint of the first bridge arm of the first full-bridge circuit of the next bridge amplifier, the midpoint of the second bridge arm of the second full-bridge circuit of each bridge amplifier is electrically connected to the midpoint of the first bridge arm of the second full-bridge circuit of the next bridge amplifier, and the midpoint of the first bridge arm of the first full-bridge circuit of the first bridge amplifier is electrically connected to the midpoint of the first bridge arm of the second full-bridge circuit of the first bridge amplifier via a first winding and a second winding of a first coupling inductor, the midpoint of the first bridge arm of the first full-bridge circuit of the first bridge amplifier is electrically connected to a first end of the gradient coil via the first winding of the first coupling inductor, and the midpoint of the second bridge arm of the first full-bridge circuit of the last bridge amplifier is electrically connected to the midpoint of the second bridge arm of the second full-bridge circuit of the last bridge amplifier via a first winding and a second winding of a second coupling inductor, the midpoint of the second bridge arm of the first full-bridge circuit of the last bridge amplifier is electrically connected to a second end of the gradient coil via the first winding of the second coupling inductor.

In some embodiments, the switch component is a wide band gap device.

In some embodiments, each bridge amplifier includes at least one full-bridge circuit, the full-bridge circuit includes at least one switching component, the switching component is formed by a plurality of switching transistors connected in parallel, when the lowest switching frequency of the gradient driver module is less than a first threshold, the gradient amplifier driver stage circuit further includes a filter.

In some embodiments, the gradient driver module includes a plurality of operating gradient driver modules and at least one redundant gradient driver module, and in a normal operating mode, the plurality of operating gradient drivers operate while at least one redundant gradient driver module is not operating; when one of the operating gradient driver modules fails, one of the at least one redundant gradient driver module operates in place of the failed operating gradient driver module.

According to a second aspect of the present disclosure, there is provided a gradient amplifier system, including a controller and the gradient amplifier driver stage circuit as described above, the controller is configured to control the gradient amplifier driver stage circuit.

According to a third aspect of the present disclosure, there is provided a method for controlling a gradient amplifier driver stage circuit, the gradient amplifier driver stage circuit including a gradient coil and a plurality of gradient driver modules, the plurality of gradient driver modules being electrically connected and forming an output end, the output end being electrically connected to the gradient coil, wherein each gradient driver module includes a pre-stage power supply and a bridge amplifier connected in parallel, output voltage of the pre-stage power supplies of the plurality of gradient driver modules are the same, and each gradient driver module is configured to provide an inductive voltage drop and a resistive voltage drop on the gradient coil, the gradient amplifier driver stage circuit is included in a gradient amplifier system, the gradient amplifier system further includes a controller configured to control the gradient amplifier driver stage circuit, and the method includes: dividing the plurality of gradient driver modules into a plurality of module groups, and the gradient driver modules in each module group are operated in the same manner; and changing the grouping mode or the operating state of the gradient driver modules in each module group based on an external control command changing or an operating state of each module group changing.

In some embodiments, the controller is configured to control the gradient amplifier driver stage circuit according to a current reference signal, the pattern of the external control command changing includes a slew rate of the current reference signal changing or an amplitude of the current reference signal changing, and the pattern of the operating state changing includes: temperature of the gradient amplifier driver stage circuit changing.

In some embodiments, the pattern of changing the operating mode includes changing a switching frequency and changing a modulation mode.

In some embodiments, the pattern of changing the grouping mode includes changing a number of modules in a group or changing a combination mode of modules.

In some embodiments, changing the grouping mode or the operating mode of the gradient driver modules in each module group based on an external control command changing or an operating state of each module group changing includes: when temperature of the gradient amplifier system become higher than a first threshold, all module groups are controlled with a unipolar modulation mode.

In some embodiments, changing the grouping mode or the operating mode of the gradient driver modules in each module group based on an external control command changing or an operating state of each module group changing includes: in a state where a temperature of the gradient amplifier system becomes lower than or equal to a first threshold, when a lasting time during which an amplitude of a current reference control signal becomes less than or equal to a third threshold exceeds a first lasting time or a slew rate of a current reference signal becomes higher than a second threshold, the switch components contained in all of the module groups are operated at a first switching frequency, and when the lasting time during which the amplitude of the current reference control signal becomes less than the third threshold does not exceed the first lasting time and the slew rate of the current reference signal becomes lower than or equal to the second threshold, or the slew rate of the current reference signal becomes less than or equal to the second threshold and the amplitude of the current reference control signal becomes larger than the third threshold, the switch components contained in all of the module groups are operated at a second switching frequency.

In some embodiments, changing the grouping or the operating mode of the gradient driver modules in each module group based on an external control command changing or an operating state of each module group changing includes: in a state where a temperature of the gradient amplifier system is lower than or equal to a first threshold, when a lasting time during which an amplitude of a current reference control signal becomes less than or equal to a third threshold exceeds a first lasting time or a slew rate of a current reference signal becomes hither than a second threshold, all of the module groups are controlled with a frequency multiplication modulation mode, and when the lasting time during which the amplitude of the current reference control signal becomes less than the third threshold does not exceed the first lasting time and the slew rate of the current reference signal is less than or equal to the second threshold, or the slew rate of the current reference signal becomes lower than or equal to the second threshold and the amplitude of the current reference control signal becomes higher than the third threshold, all of the module groups are controlled with a unipolar modulation mode.

It should be understood that both the foregoing general description and the following detailed description are exemplary and explanatory only and are not restrictive of the disclosure.

BRIEF DESCRIPTION OF THE DRAWINGS

The accompanying drawing herein, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with aspects related to the present disclosure as recited in the appended claims.

Figure 1:
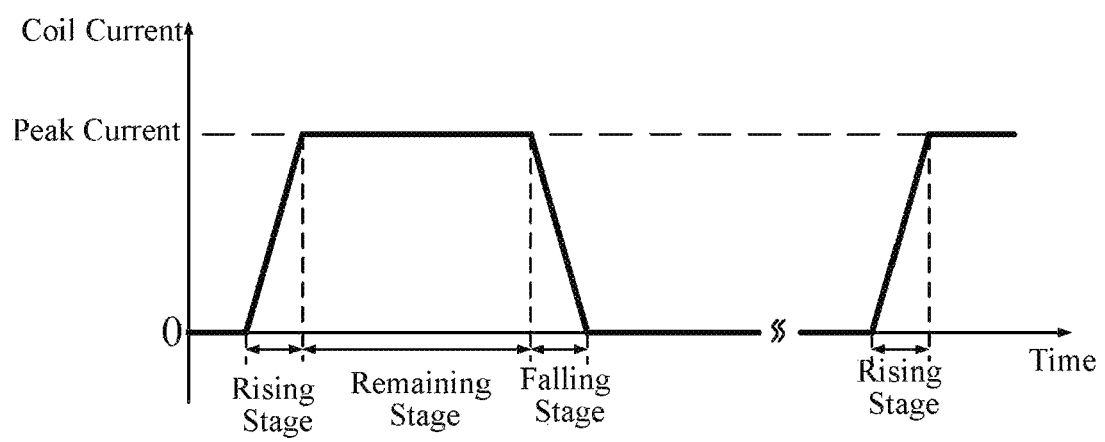
FIG. 1 illustrates a current waveform of a conventional gradient coil in the prior art.
Figure 2A:
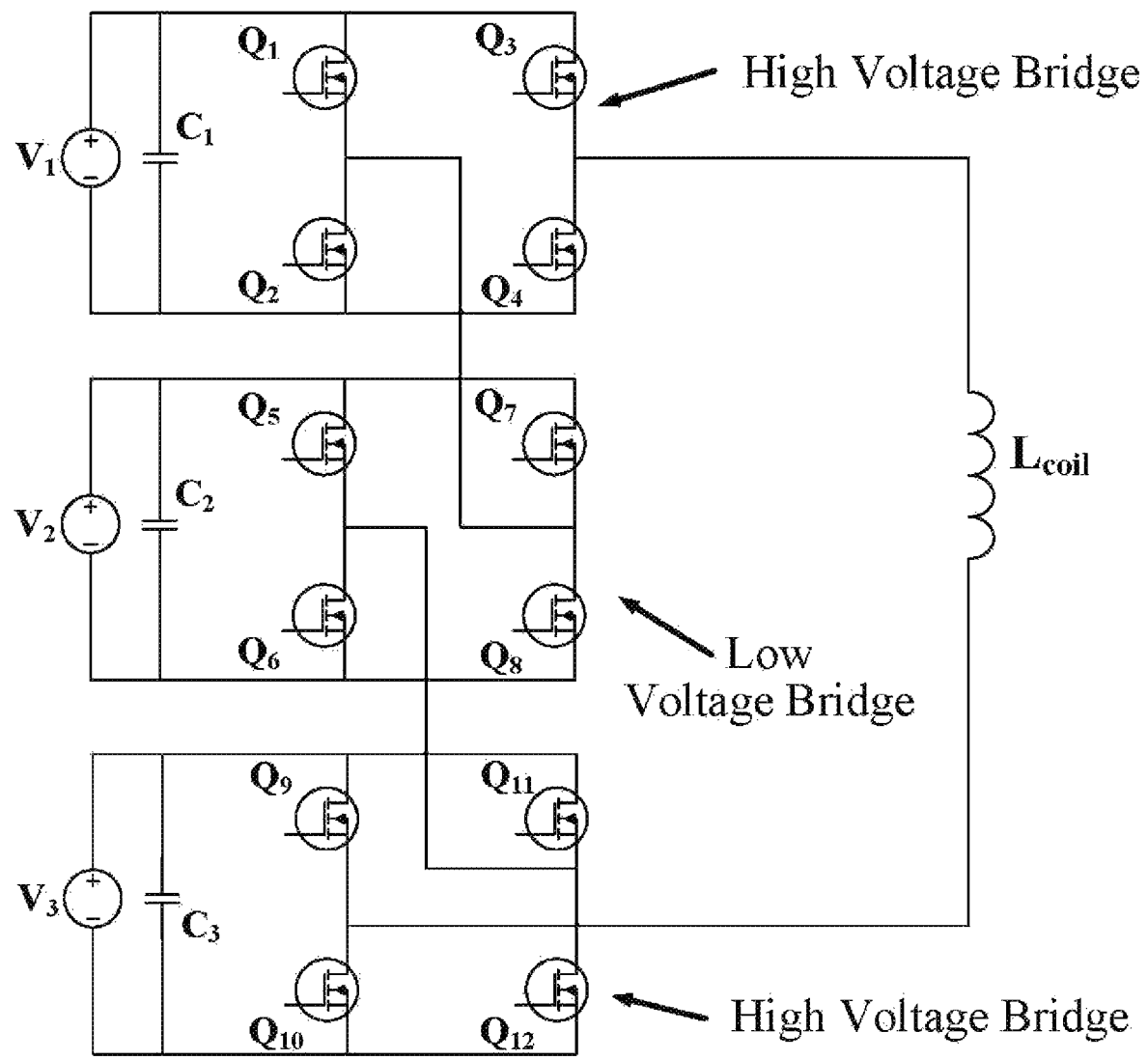
FIG. 2A illustrates a structure of a gradient amplifier driver stage circuit in the prior art.

Due to the operation mode of the gradient amplifier and the characteristics of a silicon-based device, the device has to withstand a large reverse recovery current during the switching process. To solve this problem, IGBT devices are widely used in gradient amplifiers. However, the high voltage IGBT device operates at a relatively low speed. To improve system performance, a gradient amplifier driver stage circuit is provided as shown in FIG. 2A. In such gradient amplifier driver stage circuit, two high-voltage full-bridge converters are connected in series with one low-voltage full-bridge converter. The two series-interleaved high-voltage full-bridge converters are only configured to output high voltage, and only operate in the stages with high current slew rate, and do not operate in other stages. In the stages with low current slew rate and for outputting high-precision and stable current, the low-voltage full-bridge converter operates. In order to reduce the output current ripple during the low current slew rate stage, it is necessary to increase the switching frequency of the entire system. However, due to the device characteristics, not only the switching frequency is limited, but also thermal problem of the low-voltage full-bridge converter is difficult to deal with. Also, a single switching device cannot handle the large current.

Figure 2B:
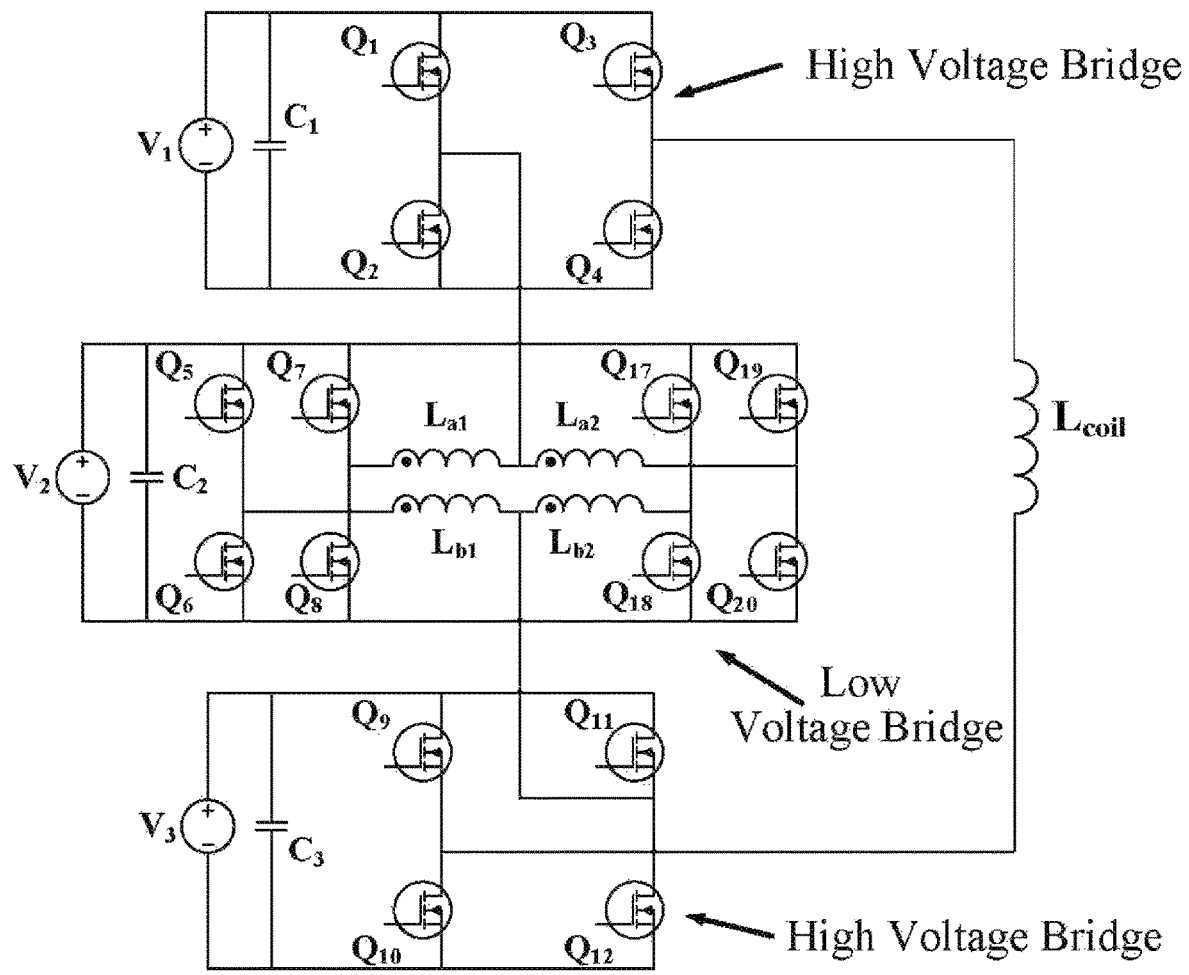
FIG. 2B illustrates a structure of a gradient amplifier driver stage circuit in the prior art in which a low-voltage bridge in an interleaved parallel configuration is used in place of the single low-voltage bridge in FIG. 2A.

Thus, a topology of an interleaved low-voltage bridge as shown in FIG. 2B may be used to take place of the single low-voltage full-bridge of FIG. 2A. The advantage of this topology is that it can effectively increase the frequency of the output current ripple, while the switching frequency of each low-voltage bridge can be maintained at a low level, thus reducing switching losses. However, this topology still fails to solve the thermal distribution problem. Since the high-voltage bridge only operates at the stage with high current slew rate, the duration of this stage is very short, so that most of the loss generated by the low-voltage bridge. Thus, the switching device utilization of the high-voltage bridge is extremely low, and the uneven thermal distribution problem of the device is serious, which could lower the reliability of the whole system, and the thermal dissipation system design faced great challenge. Moreover, due to the large difference between the bus voltage of the high-voltage bridge and low-voltage bridge, the high-voltage and low-voltage bridge converters and their pre-stage power supplies differ greatly in structure. The high-voltage and low-voltage bridges are controlled separately, and the whole system is highly complex. In addition, for different grades of nuclear magnetic resonance systems, high-voltage and low-voltage bridge converters and their pre-stage power supplies need to be redesigned, so the system expansion is difficult.

The present disclosure provides a gradient amplifier driver stage circuit, a gradient amplifier system including the gradient amplifier driver stage circuit, and a control method thereof.

The present disclosure provides a gradient amplifier driver stage circuit. The gradient amplifier driver stage circuit includes a full-bridge circuit, which is applied to all gradient driver modules, without distinguishing a high-voltage bridge and a low-voltage bridge, which can improve the utilization of the full-bridge circuit. The full-bridge circuit does not need to operate in a time divisional manner, so the thermal distribution performance is excellent. By means of module grouping and grouping control of the gradient amplifier driver stage circuit, the drive circuit of the gradient amplifier can be consistent, and the control mode can be consistent for each module group, which can facilitate the system expansion. The interfaces in the controller are identical, which can facilitate the control circuit design. In practical applications, the division of module groups can be re-divided and separately controlled as desired, and thus the flexibility of the system is improved.

Figure 3:
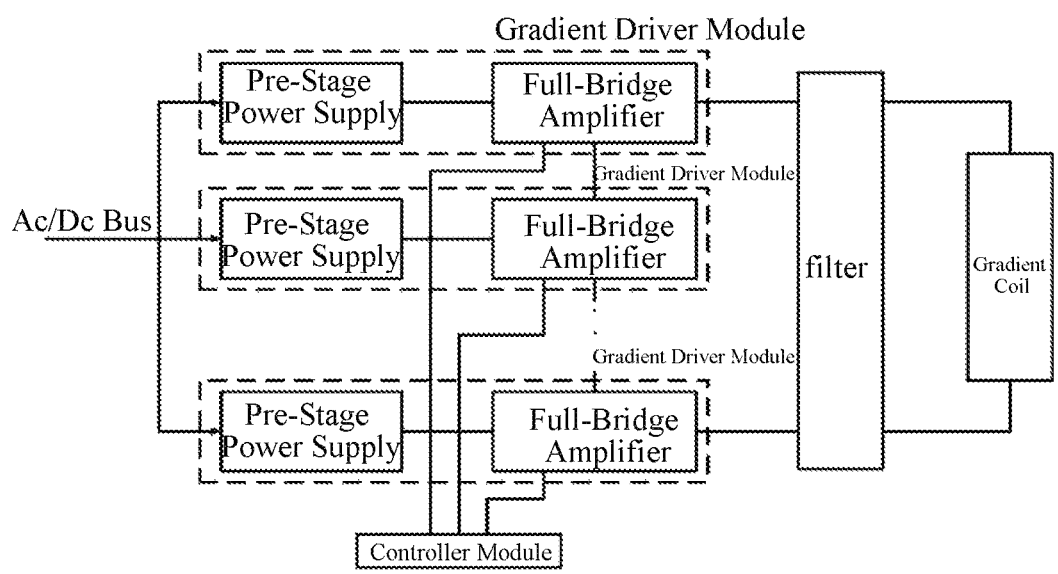
FIG. 3 illustrates a block diagram of a gradient amplifier system according to an embodiment of the present disclosure.

FIG. 3 illustrates a block diagram of a gradient amplifier system including a control module and a drive stage circuit. The load of the gradient amplifier system is a gradient coil, and the driver stage circuit in the system includes several gradient driver modules in series. The internal structures, functions, and control interfaces of the gradient driver modules are identical.

Each gradient driver module is composed of a pre-stage power supply and a full-bridge amplifier, and the pre-stage power supply and the full-bridge amplifier are coupled in parallel.

The pre-stage power supply is configured to convert the voltage input from the bus line and feed the converted voltage to the full-bridge amplifier. Depending on the final assembly structure of the gradient amplifier system, the pre-stage power supply can adopt an isolation scheme or a non-isolation scheme, and can be an AC/DC converter or a DC/DC converter. For example, in an exemplary embodiment, the pre-stage power supply may employ an isolated DC/DC converter scheme of a phase shifting bridge topology.

The full-bridge amplifier is configured to convert the DC power from the pre-stage power supply and provide the required energy to the load, ensuring that the current in the gradient coil can track the reference signal with high accuracy and efficiency.

The control module is configured to control the timing sequence of each gradient driver module, and according to external control reference signals, current system thermal conditions and other conditions, a reasonable timing sequence is formulated to ensure that the entire system can work stably and reliably. Since the modules have the same structure, function and control interface, the high voltage and the low voltage bridge are no longer distinguished in the present disclosure. For the control module, all the full-bridge amplifier modules are completely equal, so the structure of the drive stage circuit can effectively reduce the design complexity of the control system.

As shown in FIG. 3, the gradient amplifier driver stage circuit provided by the present disclosure includes: a gradient coil and a plurality of gradient driver modules. The plurality of gradient driver modules are electrically cascaded with each other and form an output end, and the output end is electrically connected to the gradient coil. Each gradient driver module includes a pre-stage power supply and a bridge amplifier connected in parallel. The output voltages of the pre-stage power supplies of the plurality of gradient driver modules are equal to each other. Each gradient driver module is configured to provide an inductive voltage drop and a resistive voltage drop on the gradient coil. The gradient coil can be considered as an inductor part and a resistance part connected in series. The inductive voltage drops on the inductor part of the gradient coil, which excites the gradient current and follows the external control command rapidly. The resistive voltage is used to compensate the voltage drop on the resistance part of the gradient coil, which prevents the gradient coil energy from consuming by the resistance part of the gradient coil and ensures the current of the gradient coil to follow the external control command stably. The topologies of the plurality of gradient driver modules are the same, and the control signal interfaces of the plurality of gradient driver modules are the same.

Figure 4:
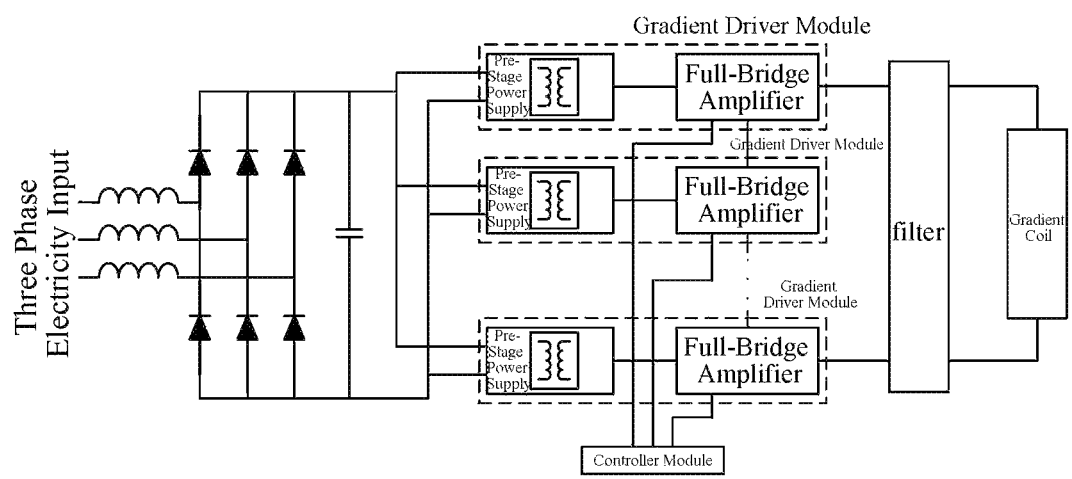
FIG. 4 illustrates a circuit topology of a gradient amplifier driver stage circuit according to an embodiment of the present disclosure.
Figure 5:
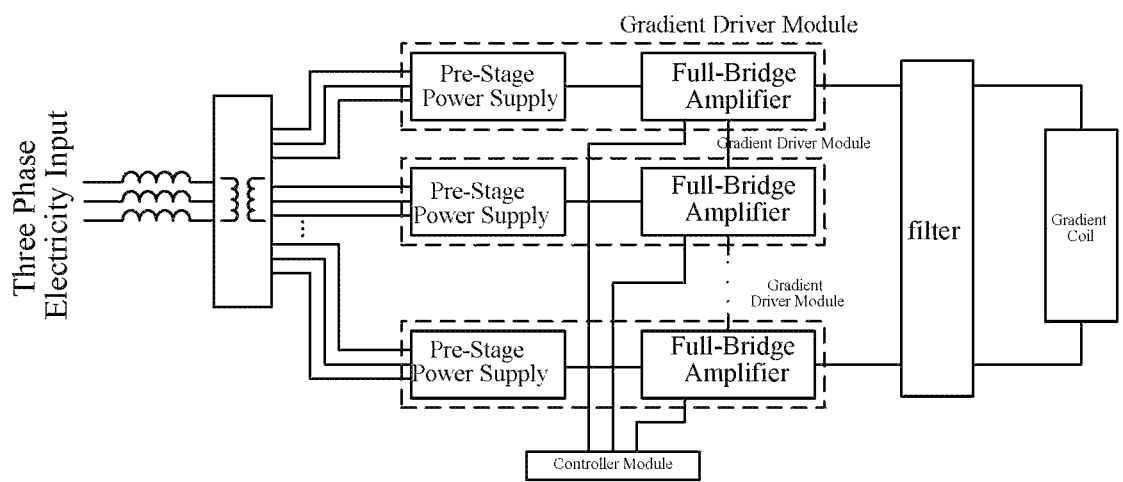
FIG. 5 illustrates a circuit topology of a gradient amplifier driver stage circuit according to another embodiment of the present disclosure.

FIGS. 4 and 5 illustrate examples of gradient amplifier driver stage circuits employing different pre-stage power supplies, respectively. FIG. 4 illustrates a circuit topology of a gradient amplifier driver stage circuit according to an embodiment of the present disclosure, in which three-phase alternating current is rectified and converted into a direct current voltage and then fed to a pre-stage power supply which is a DC/DC isolation converter. FIG. 5 illustrates a circuit topology of a gradient amplifier driver stage circuit according to another embodiment of the present disclosure, in which three-phase AC voltage is isolated by an AC transformer and fed into each gradient driver module. At this time, the input voltage of the gradient driver module is AC voltage. The pre-stage power supply is an AC/DC non-isolated converter.

Figure 6:
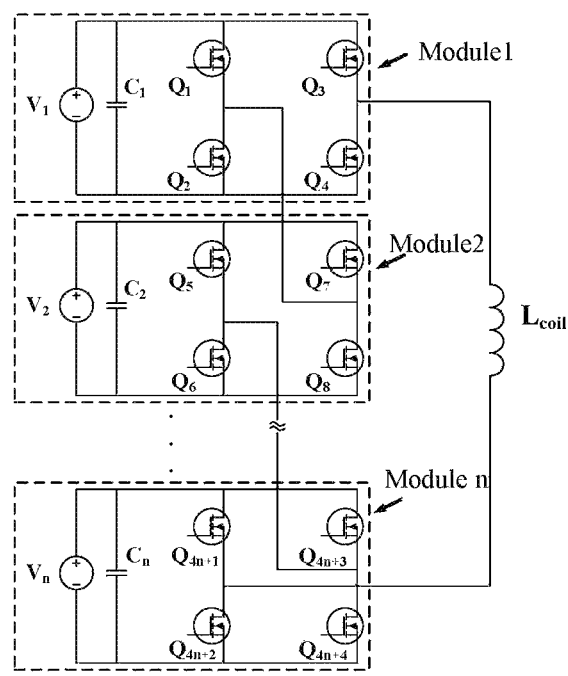
FIG. 6 illustrates a full-bridge amplifier topology in a gradient amplifier driver stage circuit according to an embodiment of the present disclosure.

FIG. 6 illustrates a full-bridge amplifier topology in a gradient amplifier driver stage circuit according to an embodiment of the present disclosure, in which a full-bridge amplifier in each gradient driver module is composed of a single, identically constructed, and a plurality of gradient driver modules are connected in series to form a drive stage circuit.

As shown in FIG. 6, each bridge amplifier includes a full-bridge circuit, and each full-bridge circuit consists of four switch components. In each full-bridge circuit, a second end of a first switch component is connected to a first end of a second switch component to form a first bridge arm, and the connection point thereof is a midpoint of the first bridge arm. A second end of a third switch component of each full-bridge circuit is connected to a first end of a fourth switch component to form a second bridge arm, and the connection point is a midpoint of the second bridge arm. A first end of the first switch component and a first end of the third switch component are electrically connected to a first output end of the pre-stage power supply, and a second end of a second switch component and a second end of a fourth switch component are electrically connected to a second output end of the pre-stage power supply.

The full-bridge circuits of the plurality of gradient driver modules are connected in series, the midpoint of the first bridge arm of each full-bridge circuit is connected to the midpoint of the second bridge arm of the next full-bridge circuit, the midpoint of the second bridge arm of the first full bridge circuit in series is electrically connected to a first end of the gradient coil, and the midpoint of the first bridge arm of the last full bridge circuit is electrically connected to a second end of the gradient coil.

Figure 7:
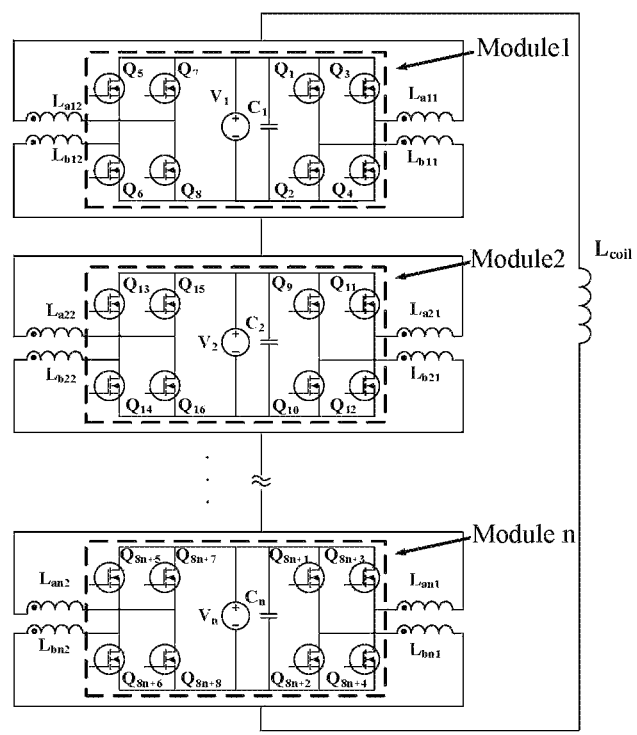
FIG. 7 illustrates a full-bridge amplifier topology in a gradient amplifier driver stage circuit according to another embodiment of the present disclosure.

FIG. 7 illustrates a full-bridge amplifier topology in a gradient amplifier driver stage circuit according to another embodiment of the present disclosure, in which a full-bridge amplifier in each gradient driver module is composed of two identical full bridges. After the two sets of full-bridges in the module are connected in parallel by a coupling inductor, the plurality of gradient driver modules are connected in series to form a drive stage circuit.

As shown in FIG. 7, the gradient amplifier driver stage circuit includes at least one coupling inductor, each bridge amplifier includes a first full-bridge circuit and a second full-bridge circuit, and the first full-bridge circuit is connected in parallel with the second full-bridge circuit. The first full-bridge circuit and the second full-bridge circuit are each composed of four switch components. In each full-bridge circuit, the second end of the first switch component is connected to the first end of the second switch component to form a first bridge arm, and the connection point is a midpoint of the first bridge arm. The second end of the third switch component of the first full-bridge circuit is connected to the first end of the fourth switch component to form a second bridge arm, and the connection point is a midpoint of the second bridge arm.

In each bridge amplifier, the first full-bridge circuit and the second full-bridge circuit are connected in parallel. The first end of the first switch component and the first end of the third switch component of the first full-bridge circuit and the second full-bridge circuit are electrically connected to the first output end of the pre-stage power supply. The second end of the second switch component and the second end of the fourth switch component of the first full-bridge circuit and the second full-bridge circuit are electrically connected to the second output end of the pre-stage power supply.

In each bridge amplifier, the midpoint of the first bridge arm of the first full-bridge circuit is electrically connected to the midpoint of the first bridge arm of the second full-bridge circuit via a first winding and a second winding of a first coupling inductor, and a connection point of the first winding and the second winding of the first coupling inductor is a first connection output end of bridge amplifier. The midpoint of the second bridge arm of the first full-bridge circuit is electrically connected to the midpoint of the second bridge arm of the second full-bridge circuit via a first winding and a second winding of a second coupling inductor, and a connection point of the first winding and the second winding of the second coupling inductor is a second connection output end of the bridge amplifier.

The bridge amplifiers of the plurality of gradient driver modules are connected in series. The second connection output end of each bridge amplifier is connected to the first connection output end of the next bridge amplifier. The first connection output end of the first bridge amplifier in series is electrically connected to the first end of the gradient coil, and the second connection output end of the last bridge amplifier in series is electrically connected to the second end of the gradient coil.

Figure 8:
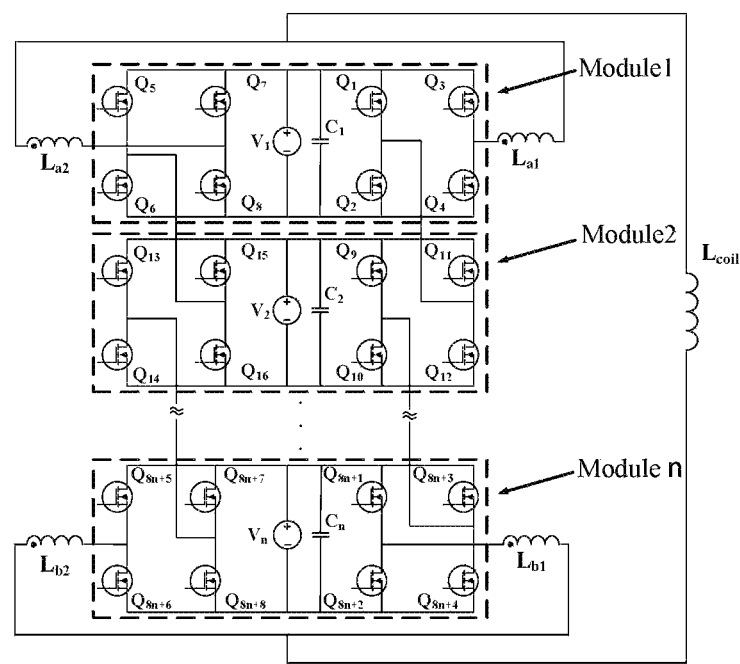
FIG. 8 illustrates a full-bridge amplifier topology in a gradient amplifier driver stage circuit according to still another embodiment of the present disclosure.

FIG. 8 illustrates a full-bridge amplifier topology in a gradient amplifier driver stage circuit according to still another embodiment of the present disclosure, in which the full-bridge amplifier in each gradient driver module is composed of two groups of identical full-bridges. Full-bridge amplifiers in one of the two groups are connected in series in the plurality of gradient driver modules. The group of full-bridge amplifiers in series is connected in parallel with the other group of full-bridge amplifiers in series via a coupling inductor to form a drive stage.

As shown in FIG. 8, the gradient amplifier driver stage circuit includes at least one coupling inductor, each bridge amplifier including a first full-bridge circuit and a second full-bridge circuit, each of the first full-bridge circuit and the second full-bridge circuit is composed of four switch components and includes a first bridge arm and a second bridge arm.

The second end of the first switch component of each full-bridge circuit is connected to the first end of the second switch component to form a first bridge arm, and the connection point is a midpoint of the first bridge arm. The second end of the third switch component of the first full-bridge circuit is connected to the first end of the fourth switch component to form a second bridge arm, and the connection point is a midpoint of the second bridge arm.

In each bridge amplifier, the first full-bridge circuit and the second full-bridge circuit are connected in parallel, the first end of the first switch component and the first end of the third switch component are electrically connected to the first output end of the pre-stage power supply, and the second end of the second switch component and the second end of the fourth switch component are electrically connected to the second output end of the pre-stage power supply.

The first full-bridge circuits of the bridge amplifiers of the plurality of gradient driver modules are connected in series, and the second full-bridge circuits thereof are connected in series. The midpoint of the second bridge arm of the first full-bridge circuit of each bridge amplifier is electrically connected to the midpoint of the first bridge arm of the first full-bridge circuit of the next bridge amplifier. The midpoint of the second bridge arm of the second full-bridge circuit of each bridge amplifier is electrically connected to the midpoint of the first bridge arm of the second full-bridge circuit of the next bridge amplifier. The midpoint of the first bridge arm of the first full-bridge circuit of the first bridge amplifier is electrically connected to the midpoint of the first bridge arm of the second full-bridge circuit of the first bridge amplifier via the first winding and the second winding of the first coupling inductor. The midpoint of the first bridge arm of the first full-bridge circuit of the first bridge amplifier is electrically connected to the first end of the gradient coil via the first winding of the first coupling inductor. The midpoint of the second bridge arm of the first full-bridge circuit of the last bridge amplifier is electrically connected to the midpoint of the second bridge arm of the second full-bridge circuit of the last bridge amplifier via the first winding and the second winding of the second coupling inductor. The midpoint of the second bridge arm of the first full-bridge circuit of the last bridge amplifier is electrically connected to the second end of the gradient coil via the first winding of the second coupling inductor.

It should be understood that in the above embodiments, the pre-stage power supplies of the plurality of gradient driver modules may be isolated or non-isolated circuits. The pre-stage power supplies of the plurality of gradient driver modules may be DC/DC or AC/DC circuits. For example, the pre-stage power supplies of the plurality of gradient driver modules may be isolated DC/DC circuits.

In the above embodiment, each bridge amplifier includes at least one full-bridge circuit, the full-bridge circuit includes at least one switch component, and the switch component is formed by a plurality of switches connected in parallel. When the lowest switching frequency of the gradient driver module is less than the first threshold, the gradient amplifier driver stage circuit also includes a filter.

Generally, the gradient amplifier driver stage circuit includes a filter. However, when the switching frequency is above a first threshold, the filter may be omitted in accordance with an embodiment of the present disclosure.

In this embodiment, when the switching frequency of the gradient driver module than the first threshold, i.e., $R_{system}^* (U_{IN} - I_O^* R_{system})/(U_{IN}^* k^* n^* L_{coil})$, the gradient amplifier driver stage circuit also includes a filter.

Wherein, $U_{IN}$ is the input voltage of a single stage driver, n is the number of full-bridge circuits in operation, $R_{system}$ is the system conduction impedance, $I_o$ is the output current flowing through the gradient coil, k is the ripple coefficient, and $L_{coil}$ is the inductance value of the gradient coil.

The drive stage circuit proposed in the present disclosure adopts a novel switching device, and the operating frequency is greatly improved compared with the conventional device. In combination with the control method proposed in the present disclosure, the output current ripple frequency can be greatly improved. In an embodiment, the gradient amplifier consists of six series interleaved drivers of single-bridge structure with an input voltage of 400V. The system has an internal resistance of 42.4 mohm. When the output current is 900 A and the inductance of the gradient coil is 998 uH, the switching frequency is increased to 65 KHz or higher. The ripple current can be less than 0.01% of the output current, and the output filter can be omitted to further save system space.

In the gradient amplifier driver stage circuit of the present disclosure, optionally, the gradient driver module may include a plurality of operating gradient driver modules and at least one redundant gradient driver module. Under normal operating conditions, the plurality of operating gradient driver modules operate while at least one redundant gradient driver module is not in operation. When one of the operating gradient drive modules fails, one of the at least one redundant gradient drive module can operate in place of the failed operating gradient drive module.

In the gradient amplifier driver stage circuit as described above, the switching component is a wide band gap device. The present disclosure utilizes the characteristics of the wide band gap switching device, and proposes a novel drive stage structure of the gradient amplifier and its control mode, which can effectively solve the problem such as uneven thermal distribution, poor reliability, and difficulty to expand for the system, which is suffered by the conventional gradient amplifier.

In recent years, wide band gap switching devices, such as SiC, GaN, etc., compared with first generation materials such as semiconductor silicon, have advantages of wide band gap, high thermal conductivity, high electron saturation and escape rate, good chemical stability, high withstand voltage, no reverse recovery, low on-resistance and fast switching speed. Compared to conventional silicon-based IGBTs, power switching devices fabricated with these new materials have advantages such as high withstand voltage, no reverse recovery, low on-resistance and fast switching speed. Utilizing this characteristic of wide band gap switching devices, the present disclosure disclosed a gradient amplifier driver stage circuit in which the full-bridge amplifier topologies of the plurality of gradient driver modules are identical. When the full-bridge amplifier is in operation, high and low voltage bridges are no longer distinguished, and thus the high and low voltage sides do not need to operate in a time divisional manner. Since each full-bridge amplifier in the driver module has the same structure, it provides many conveniences. For example, the output voltage and structure of the pre-stage power supply are the same, the control signal interface of the full-bridge amplifier is the same, and the controller can flexibly control it to flexibly change the operating mode and grouping control mode of the full-bridge amplifier or the gradient driver module group composed of the plurality of full-bridge amplifiers, thereby effectively balancing the loss and performance, which can effectively solve the disadvantages of the conventional gradient amplifier, such as uneven thermal distribution problem, low device utilization, poor reliability, complex system and difficulty to expand, etc.

Figure 9:
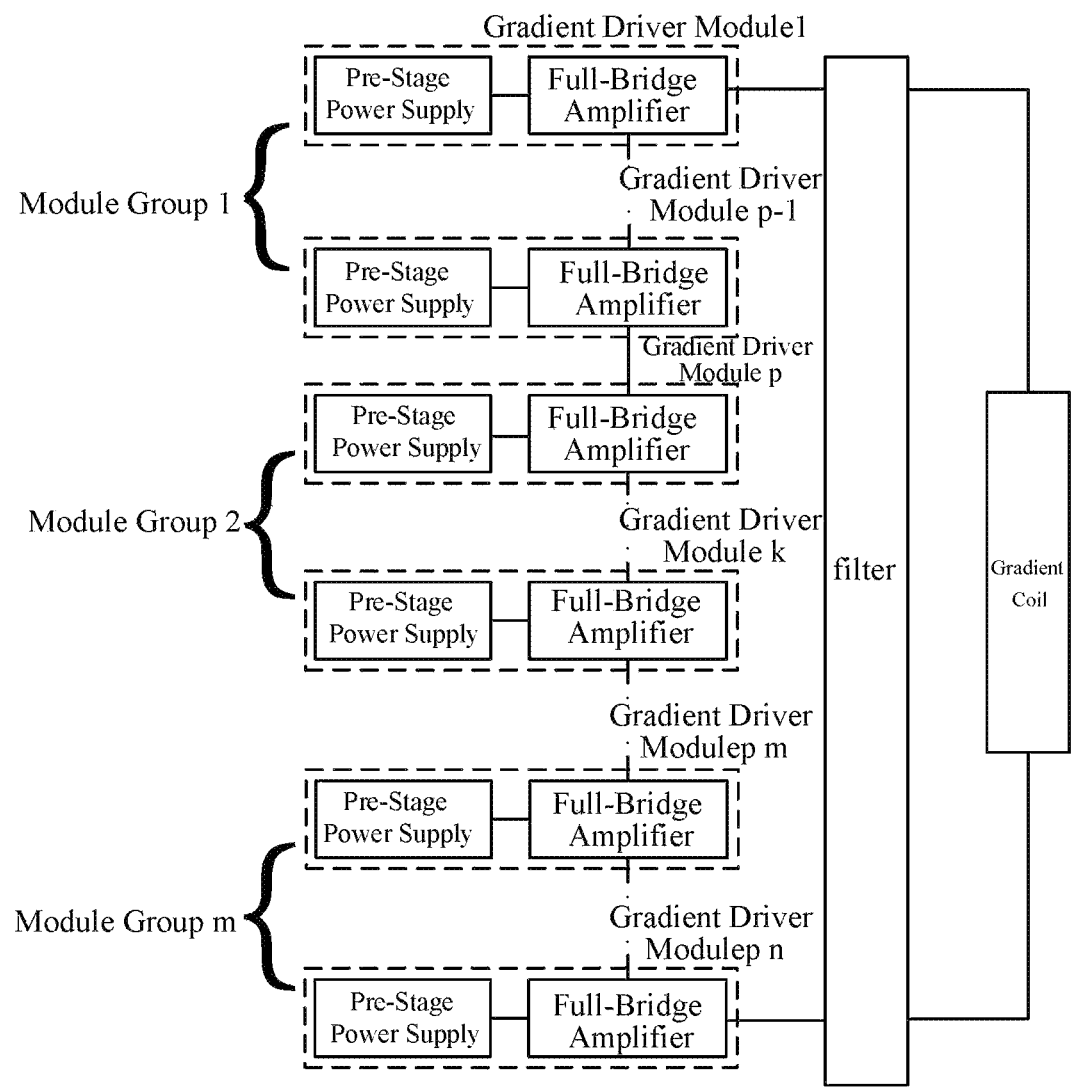
FIG. 9 is a diagram illustrating a control method of a gradient driver module according to an embodiment of the present disclosure.

In accordance with an embodiment of the present disclosure, there is also provided a method for controlling a gradient amplifier driver stage circuit. FIG. 9 is a diagram illustrating a control method of a gradient driver module according to an embodiment of the present disclosure.

As shown in FIG. 9, the gradient amplifier driver stage circuit includes a gradient coil and a plurality of gradient driver modules. The plurality of gradient driver modules are electrically cascaded with each other and form an output end, and the output end is electrically connected to the gradient coil. Each gradient driver module includes a pre-stage power supply and a bridge amplifier connected in parallel. The output voltage of the pre-stage power supplies of the plurality of gradient driver modules are the same. Each gradient driver module is configured to provide an inductive voltage drop and a resistive voltage drop on the gradient coil. The gradient amplifier driver stage circuit is included in a gradient amplifier system, and the gradient amplifier system further includes a control module (not shown). The control module is configured to control the gradient amplifier driver stage circuit. The gradient coil can be considered as an inductor part and a resistance part connected in series. The inductive voltage drops on the inductor part of the gradient coil, which excites the gradient current and follows the external control command rapidly. The resistive voltage is used to compensate the voltage drop on the resistance part of the gradient coil, which prevents the gradient coil energy from consuming by the resistance part of the gradient coil and ensures the current of the gradient coil to follow the external control command stably.

The method for controlling a gradient amplifier driver stage circuit includes: dividing a plurality of gradient driver modules into a plurality of module groups, i.e., module group 1, module group 2, . . . module group m. The module group 1 includes a gradient driver module 1 to a gradient driver module p−1; the module group 2 includes a gradient driver module p to a gradient driver module k; and the module group m includes a gradient driver module m to a gradient driver module n. The gradient driver modules in each module group operate in the same mode. According to an external control command for each module group or the operating state changing, the grouping or the operating mode of the gradient driver modules within each module group can be changed. With module grouping control method, each gradient module operating state in system, like temperature, output current, could be dynamically controlled by controller through changing the module grouping and operating mode thereof. The module grouping control method has the advantage of rapid response and high flexible.

In this embodiment, the control module controls the gradient amplifier driver stage circuit according to a current reference signal. The pattern of the external control command changing includes the current reference signal slew rate changing or the amplitude of the current reference signal changing. The pattern of the operating state changing includes temperature of the driver stage circuit of the gradient amplifier changing. The pattern of changing the operating mode includes changing the switching frequency, changing the modulation mode, and changing the interleaving operation mode. The grouping may be changed by changing the number of modules in the group or by changing the combination mode of the modules. In FIG. 9, for the control module, each gradient driver module has the same priority. Therefore, in practical applications, all gradient driver modules can be assigned to any gradient driver module group, and the number of internal modules can be the same or different among groups. Within each module group, the modulation mode, switching frequency, and interleaving mode of each module are the same. Among different module groups, the modulation mode, switching frequency, and interleaving mode of each module may be the same or different.

In the gradient amplifier driver stage circuit, the grouping or the operation mode of the gradient driver module in each module group may be changed according to the operating state of each module group changing. In an embodiment, when the temperature of the amplifier system becomes lower than or equal to the first threshold, all the module groups may be controlled with the frequency multiplication modulation mode or the unipolar modulation mode according to the amplitude of the current reference control signal and the slew rate of the current reference signal. When the system temperature is higher than the first threshold, all module groups are controlled with the unipolar modulation mode. In another embodiment, when the temperature of the amplifier system becomes lower than or equal to the first threshold, the switch components in all the module groups may be operated at a first switching frequency or a second switching frequency according to the amplitude of the current reference control signal and the slew rate of the current reference signal. When the system temperature is higher than the first threshold, the switch components in all module groups are operated at the second switching frequency. In still another embodiment, when the temperature of the amplifier system becomes lower than or equal to the first threshold, all modules may be controlled with the frequency multiplication modulation method according to the amplitude of the current reference control signal and the slew rate of the current reference signal, and the switch components in all module groups are operated at the first switching frequency. When the temperature of the amplifier system is higher than the first threshold, all modules are divided into two groups, with two modules of all modules having the lower temperature being taken as the first module group, and the remaining modules being taken as the second module group. The first module group is controlled with the frequency multiplication modulation mode, and the switch component is operated at the first switching frequency; the second module group is controlled with the unipolar modulation mode, and the switch component is operated at the second switching frequency. In the gradient amplifier driver stage circuit, the grouping mode or the operating mode of the gradient driver module in each module group may also be changed according to the external control command changing of each module group. In an embodiment, in a state where the temperature of the gradient amplifier system becomes lower than or equal to the first threshold, when a lasting time during which the amplitude of the current reference control signal is less than the third threshold exceeds a first lasting time or the slew rate of the current reference signal is higher than a second threshold, all the module groups are controlled with a frequency multiplication modulation mode. When the lasting time during which the amplitude of the current reference control signal is less than the third threshold does not exceed the first lasting time and the slew rate of the current reference signal becomes lower than or equal to the second threshold, or when the slew rate of the current reference signal becomes lower than or equal to the second threshold and the amplitude of the current reference control signal is larger than the third threshold, all module groups are controlled with the unipolar modulation mode. In another embodiment, in a state where the temperature of the gradient amplifier system becomes lower than or equal to the first threshold, when the lasting time during which the amplitude of the current reference control signal is less than a third threshold exceeds a first lasting time and the slew rate of the current reference signal is higher than a second threshold, the switch components of all the module groups are operated at the first switching frequency. When the lasting time during which the amplitude of the current reference control signal is less than the third threshold does not exceed the first lasting time and the slew rate of the current reference signal becomes lower than or equal to the second threshold, or when the slew rate of the current reference signal becomes lower than or equal to the second threshold and the amplitude of the current reference control signal is larger than the third threshold, the switch components of all the module groups are operated at the second switching frequency. In still another embodiment, in a state where the temperature of the gradient amplifier system becomes lower than or equal to the first threshold, when the lasting time during which the amplitude of the current reference control signal is less than a third threshold exceeds a first lasting time and the slew rate of the current reference signal is higher than a second threshold, all modules are divided into two groups, with any three modules being taken as the first module group, and the remaining modules being taken as the second module group. The first module group is not operated, and the second module group is operated at the first switching frequency in the frequency multiplication modulation method for a second lasting time. Then, the second module group stops operating, and the first module group is operated at the first switching frequency in the frequency doubling modulation mode. When a lasting time during which the amplitude of the reference control signal is less than the third threshold does not exceed the first lasting time, and the slew rate of the current reference signal becomes lower than or equal to the second threshold, or the amplitude of the current reference control signal is larger than the third threshold. All modules are taken as one module group and are operated at the second switching frequency in the unipolar modulation mode. With module grouping control method, each gradient module operating state in system, like temperature, output current, could be dynamically controlled by controller through changing the module grouping and operating mode thereof. The module grouping control method has the advantage of rapid response and high flexible.

In the gradient amplifier driver stage circuit, the grouping mode or the operating mode of the gradient driver module in each module group can be changed according to the operating state of each module group and the external control command changing. When the operating state changing occurs, the controller should process the operating mode changing first.

There are various optional operating modes, and the operating mode of the gradient driver modules in each module group may be changed according to an external control command of any of the temperature of the gradient amplifier system, the amplitude of the current reference control signal, and the slew rate of the current reference signal, which will not be described one by one. The control method proposed in the present disclosure has higher flexibility and significant advantages over the conventional control method.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A gradient amplifier driver stage circuit, comprising: a gradient coil and a plurality of gradient driver modules, the plurality of gradient driver modules being electrically cascaded with each other and forming an output end, and the output end being electrically connected to the gradient coil, wherein each gradient driver module comprises a pre-stage power supply and a bridge amplifier connected in parallel, output voltages of the pre-stage power supplies of each gradient driver module are the same, and each gradient driver module is configured to provide an inductive voltage drop and a resistive voltage drop on the gradient coil.

2. The gradient amplifier driver stage circuit according to claim 1, wherein the plurality of gradient driver modules have the same topology.

3. The gradient amplifier driver stage circuit according to claim 2, wherein each bridge amplifier comprises a full-bridge circuit, and each full-bridge circuit is composed of four switch components;
wherein a second end of a first switch component of each full-bridge circuit is connected to a first end of a second switch component to form a first bridge arm, and a connection point thereof is a midpoint of the first bridge arm; a second end of a third switch component of each full-bridge circuit is connected to a first end of a fourth switch component to form a second bridge arm, and a connection point thereof is a midpoint of the second bridge arm; a first end of the first switch component and a first end of the third switch component are electrically connected to a first output end of the pre-stage power supply; and a second end of the second switch component and a second end of the fourth switch component are electrically connected to a second output end of the pre-stage power supply; and
wherein the full-bridge circuits of the plurality of gradient driver modules are connected in series, and the midpoint of the second bridge arm of each full-bridge circuit is connected to the midpoint of the first bridge arm of the next full-bridge circuit, and the midpoint of the first bridge arm of the first full-bridge circuit is electrically connected to a first end of the gradient coil, and the midpoint of the second bridge arm of the last full-bridge circuit is electrically connected to a second end of the gradient coil.

4. The gradient amplifier driver stage circuit according to claim 2, wherein the gradient amplifier driver stage circuit comprises at least one coupling inductor, each bridge amplifier comprising a first full-bridge circuit and a second full-bridge circuit, the first full-bridge circuit is connected in parallel to the second full-bridge circuit, and the first full-bridge circuit and the second full-bridge circuit are each composed of four switch components;
wherein a second end of a first switch component of each full-bridge circuit is connected to a first end of a second switch component to form a first bridge arm, and a connection point thereof is a midpoint of the first bridge arm; a second end of a third switch component of each full-bridge circuit is connected to a first end of a fourth switch component to form a second bridge arm, and the connection point thereof is a midpoint of the second bridge arm;
wherein, in each bridge amplifier, the first full-bridge circuit and the second full-bridge circuit are connected in parallel, and a first end of the first switch component and a first end of the third switch component are electrically connected to a first output end of the pre-stage power supply, and a second end of the second switch component and a second end of the fourth switch component are electrically connected to a second output end of the pre-stage power supply;
wherein, in each bridge amplifier, the midpoint of the first bridge arm of the first full-bridge circuit is electrically connected to the midpoint of the first bridge arm of the second full-bridge circuit via a first winding and a second winding of a first coupling inductor; a connection point of the first winding and the second winding of the first coupling inductor is a first connection output end corresponding to the bridge amplifier;
the midpoint of the second bridge arm of the first full-bridge circuit is electrically connected to the midpoint of the second bridge arm of the second full-bridge circuit via a first winding and a second winding of a second coupling inductor; a connection point of the first winding and the second winding of the second coupling inductor is a second connection output end corresponding to the bridge amplifier; and
wherein the bridge amplifiers of the plurality of gradient driver modules are connected in series, the second connection output end corresponding to each bridge amplifier is connected to the first connection output end corresponding to the next bridge amplifier, the first connection output end corresponding to the first bridge amplifier in series is electrically connected to a first end of the gradient coil, and the second connection output end corresponding to the last bridge amplifier in series is electrically connected to a second end of the gradient coil.

5. The gradient amplifier driver stage circuit according to claim 2, wherein the gradient amplifier driver stage circuit comprises at least one coupling inductor, each bridge amplifier comprises a first full-bridge circuit and a second full-bridge circuit, the first full-bridge circuit and the second full-bridge circuit are each composed of four switch components;

wherein a second end of a first switch component of each full-bridge circuit is connected to a first end of a second switch component to form a first bridge arm, and a connection point thereof is a midpoint of the first bridge arm; a second end of a third switch component of each full-bridge circuit is connected to a first end of a fourth switch component to form a second bridge arm, and the connection point thereof is a midpoint of the second bridge arm;

wherein, in each bridge amplifier, the first full-bridge circuit and the second full-bridge circuit are connected in parallel, and a first end of the first switch component and a first end of the third switch component are electrically connected to a first output end of the pre-stage power supply, a second end of the second switch component and a second end of the fourth switch component are electrically connected to a second output of the pre-stage power supply;

wherein the first full-bridge circuits of the bridge amplifiers of the plurality of gradient driver modules are connected in series, the second full-bridge circuits are connected in series, the midpoint of the second bridge arm of the first full-bridge circuit of each bridge amplifier is electrically connected to the midpoint of the first bridge arm of the first full-bridge circuit of the next bridge amplifier, the midpoint of the second bridge arm of the second full-bridge circuit of each bridge amplifier is electrically connected to the midpoint of the first bridge arm of the second full-bridge circuit of the next bridge amplifier, and the midpoint of the first bridge arm of the first full-bridge circuit of the first bridge amplifier is electrically connected to the midpoint of the first bridge arm of the second full-bridge circuit of the first bridge amplifier via a first winding and a second winding of a first coupling inductor, the midpoint of the first bridge arm of the first full-bridge circuit of the first bridge amplifier is electrically connected to a first end of the gradient coil via the first winding of the first coupling inductor, and the midpoint of the second bridge arm of the first full-bridge circuit of the last bridge amplifier is electrically connected to the midpoint of the second bridge arm of the second full-bridge circuit of the last bridge amplifier via a first winding and a second winding of a second coupling inductor, the midpoint of the second bridge arm of the first full-bridge circuit of the last bridge amplifier is electrically connected to a second end of the gradient coil via the first winding of the second coupling inductor.

6. The gradient amplifier driver stage circuit according to claim 1, wherein the plurality of gradient driver modules have the same control signal interfaces.

7. The gradient amplifier driver stage circuit according to claim 1, wherein the pre-stage power supplies of the plurality of gradient driver modules are isolated circuits or non-isolated circuits.

8. The gradient amplifier driver stage circuit according to claim 1, wherein the pre-stage power supplies of the plurality of gradient driver modules are DC/DC circuits or AC/DC circuits.

9. The gradient amplifier driver stage circuit according to claim 1, wherein the pre-stage power supplies of the plurality of gradient driver modules are isolated DC/DC circuits.

10. The gradient amplifier driver stage circuit according to claim 1, wherein the switch component is a wide band gap device.

11. The gradient amplifier driver stage circuit according to claim 1, wherein each bridge amplifier comprises at least one full-bridge circuit, the full-bridge circuit comprises at least one switching component, the switching component is formed by a plurality of switching transistors connected in parallel, when the lowest switching frequency of the gradient driver module is less than a first threshold, the gradient amplifier driver stage circuit further comprises a filter.

12. The gradient amplifier driver stage circuit according to claim 1, wherein the gradient driver module comprises a plurality of operating gradient driver modules and at least one redundant gradient driver module, and in a normal operating mode, the plurality of operating gradient drivers operate while at least one redundant gradient driver module is not operating; when one of the operating gradient driver modules fails, one of the at least one redundant gradient driver module operates in place of the failed operating gradient driver module.

13. A gradient amplifier system, comprising a controller and the gradient amplifier driver stage circuit according to claim 1, the controller is configured to control the gradient amplifier driver stage circuit.

14. A method for controlling a gradient amplifier driver stage circuit, the gradient amplifier driver stage circuit comprising a gradient coil and a plurality of gradient driver modules, the plurality of gradient driver modules being electrically connected and forming an output end, the output end being electrically connected to the gradient coil, wherein each gradient driver module comprises a pre-stage power supply and a bridge amplifier connected in parallel, output voltage of the pre-stage power supplies of the plurality of gradient driver modules are the same, and each gradient driver module is configured to provide an inductive voltage drop and a resistive voltage drop on the gradient coil, the gradient amplifier driver stage circuit is included in a gradient amplifier system, the gradient amplifier system further comprises a controller configured to control the gradient amplifier driver stage circuit, and the method comprises:

grouping the plurality of gradient driver modules into a plurality of module groups, wherein the gradient driver modules in each module group operate in a same operating mode; and changing the grouping mode or the operating mode of the gradient driver modules in each module group based on an external control command changing or an operating state of each module group changing.

15. The method according to claim 14, wherein the controller is configured to control the gradient amplifier driver stage circuit according to a current reference signal, the pattern of the external control command changing comprises slew rate of the current reference signal changing or an amplitude of the current reference signal changing, and the pattern of the operating state changing comprises: temperature of the gradient amplifier driver stage circuit changing.

16. The method according to claim 14, wherein the pattern of changing the operating mode comprises changing a switching frequency and changing a modulation mode.

17. The method according to claim 14, wherein the pattern of changing the grouping mode comprises changing a number of modules in a group or changing a combination mode of modules.

18. The method according to claim 14, wherein changing the grouping mode or the operating mode of the gradient driver modules in each module group based on an external control command changing or an operating state of each module group changing comprises: when temperature of the gradient amplifier system become higher than a first threshold, all module groups are controlled with a unipolar modulation mode.

19. The method according to claim 14, wherein changing the grouping mode or the operating mode of the gradient driver modules in each module group based on an external control command changing or an operating state of each module group changing comprises: in a state where a temperature of the gradient amplifier system becomes lower than or equal to a first threshold, when a lasting time during which an amplitude of a current reference control signal becomes less than or equal to a third threshold exceeds a first lasting time or a slew rate of a current reference signal becomes higher than a second threshold, the switch components contained in all of the module groups are operated at a first switching frequency, and when the lasting time during which the amplitude of the current reference control signal becomes less than the third threshold does not exceed the first lasting time and the slew rate of the current reference signal becomes lower than or equal to the second threshold, or the slew rate of the current reference signal become lower than or equal to the second threshold and the amplitude of the current reference control signal becomes larger than the third threshold, the switch components contained in all of the module groups are operated at a second switching frequency.

20. The method according to claim 14, wherein changing the grouping mode or the operating mode of the gradient driver modules in each module group based on an external control command changing or an operating state of each module group changing comprises:
    in a state where a temperature of the gradient amplifier system is lower than or equal to a first threshold,
        when a lasting time during which an amplitude of a current reference control signal becomes less than or equal to a third threshold exceeds a first lasting time or a slew rate of a current reference signal becomes higher than a second threshold, all of the module groups are controlled with a frequency multiplication modulation mode, and
        when the lasting time during which the amplitude of the current reference control signal becomes less than the third threshold does not exceed the first lasting time and the slew rate of the current reference signal becomes lower than or equal to the second threshold, or the slew rate of the current reference signal becomes lower than or equal to the second threshold and the amplitude of the current reference control signal becomes higher than the third threshold, all of the module groups are controlled with a unipolar modulation mode.

* * * * *